United States Patent
Zafarana (10) Patent No.: US 11,228,248 B1
(45) Date of Patent: Jan. 18, 2022

(54) MULTIPHASE CONTROLLER WITH FAILURE DIAGNOSTIC MECHANISM

(71) Applicant: SEMICONDUCTOR COMPONENTS INDUSTRIES, LLC, Phoenix, AZ (US)

(72) Inventor: Alessandro Zafarana, Milan (IT)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/060,216

(22) Filed: Oct. 1, 2020

Related U.S. Application Data (60) Provisional application No. 62/706,382, filed on Aug. 13, 2020.

(51) Int. Cl.
| | |
|---|---|
| *H02M 3/156* | (2006.01) |
| *H02M 3/158* | (2006.01) |
| *H03K 4/08* | (2006.01) |
| *H03K 5/01* | (2006.01) |
| *H02M 3/04* | (2006.01) |
| *H03K 5/00* | (2006.01) |

(52) U.S. Cl.
CPC ........... *H02M 3/1586* (2021.05); *H02M 3/04* (2013.01); *H02M 3/1584* (2013.01); *H03K 4/08* (2013.01); *H03K 5/01* (2013.01); *H03K 2005/00286* (2013.01)

(58) Field of Classification Search
CPC ........ H02M 3/04; H02M 3/156; H02M 3/157; H02M 3/158; H02M 3/1584; H02M 3/1586

USPC ................................ 323/234, 237, 241, 242
See application file for complete search history.

(56) References Cited

U.S. PATENT DOCUMENTS

| | | | | |
|---|---|---|---|---|
| 6,137,274 A | * | 10/2000 | Rajagopalan | ........... H02J 1/102<br>323/272 |
| RE38,846 E | * | 10/2005 | Walters | ..................... G06F 1/28<br>323/272 |

(Continued)

OTHER PUBLICATIONS

Tae-Jin Kim, Ju-Won Baek, Jin-Hong Jeon, Geun-Hie Rim and Cheul-U Kim; "A diagnosis method of DC/DC converter aging based on the variation of parasitic"; White Paper; The 30th Annual Conference of the IEEE Industrial Electronics Society; Busan, Korea; Nov. 2-6, 2004; 5 pages.

*Primary Examiner* — William Hernandez
(74) *Attorney, Agent, or Firm* — Polansky & Associates, P.L.L.C.; Paul J. Polansky; James Saragosa (57) ABSTRACT

In one form, a multiphase controller for controlling a plurality of phases using a corresponding plurality of phase controllers includes a plurality of inputs, each for receiving a respective current monitor signal, an averaging circuit for generating an averaged signal representative of an average of current monitor signals received from said plurality of inputs, wherein each phase controller generates an error voltage in response to said averaged signal and said respective current monitor signal, controls a drive signal in response to said error voltage and a control voltage, and provides a digital signal representative of a difference between said error voltage and said control voltage. The multiphase controller provides an adjustment signal representative of said digital signal divided by a corresponding output current for each phase controller, and said adjustment signal adjusts a corresponding error voltage.

20 Claims, 4 Drawing Sheets

(56) References Cited

U.S. PATENT DOCUMENTS

| | | | |
|---|---|---|---|
| 8,957,660 B2* | 2/2015 | Chen | H02M 1/084 323/288 |
| 2010/0238060 A1* | 9/2010 | Nien | H03M 1/203 341/155 |
| 2013/0293203 A1* | 11/2013 | Chen | H02M 3/1584 323/234 |
| 2014/0049240 A1* | 2/2014 | Chen | G05F 1/10 323/282 |
| 2014/0097812 A1 | 4/2014 | Fabregas et al. | |
| 2015/0263614 A1* | 9/2015 | Bansal | H02M 3/1584 323/282 |
| 2017/0214318 A1* | 7/2017 | Takenaka | H02M 1/084 |
| 2018/0351458 A1* | 12/2018 | Chen | G05F 1/10 |
| 2020/0403494 A1* | 12/2020 | Lu | H02M 3/285 |
| 2021/0312275 A1* | 10/2021 | Schwabe | H03M 1/122 |

\* cited by examiner

MULTIPHASE CONTROLLER WITH FAILURE DIAGNOSTIC MECHANISM

FIELD OF THE DISCLOSURE

This disclosure relates generally to power converters, and more specifically to multiphase power converters.

BACKGROUND

Multiphase power supplies can be used to create a direct current (DC) voltage with multiple parallel power stages. A form of these parallel power stages is a switched mode power supply that creates a DC voltage by switching current through an energy storage element such as an inductor. A multiphase controller controls the duty cycles of the power stages to regulate the output voltage to a desired level. An example of such multiphase controller is a three phase controller that receives a feedback voltage representative of the output voltage and current sense information representing current through each phase in order to control the duty cycle of each power stage.

Over time, the power transistors used in power stages experience aging, which affects the resistivity of the power stage. As the resistivity of the power stage changes, the efficiency and lifespan of the system can deteriorate. The effect of normal aging on resistivity can be predicted in existing power supplies; however, manufacturing defects, solder defects, and other abnormalities can change the resistivity of the power stage in unpredictable ways. Known methods of monitoring an abnormal change in resistivity of a power stage in multiphase controllers and responsively adjusting operation are expensive, inaccurate, or inefficient.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
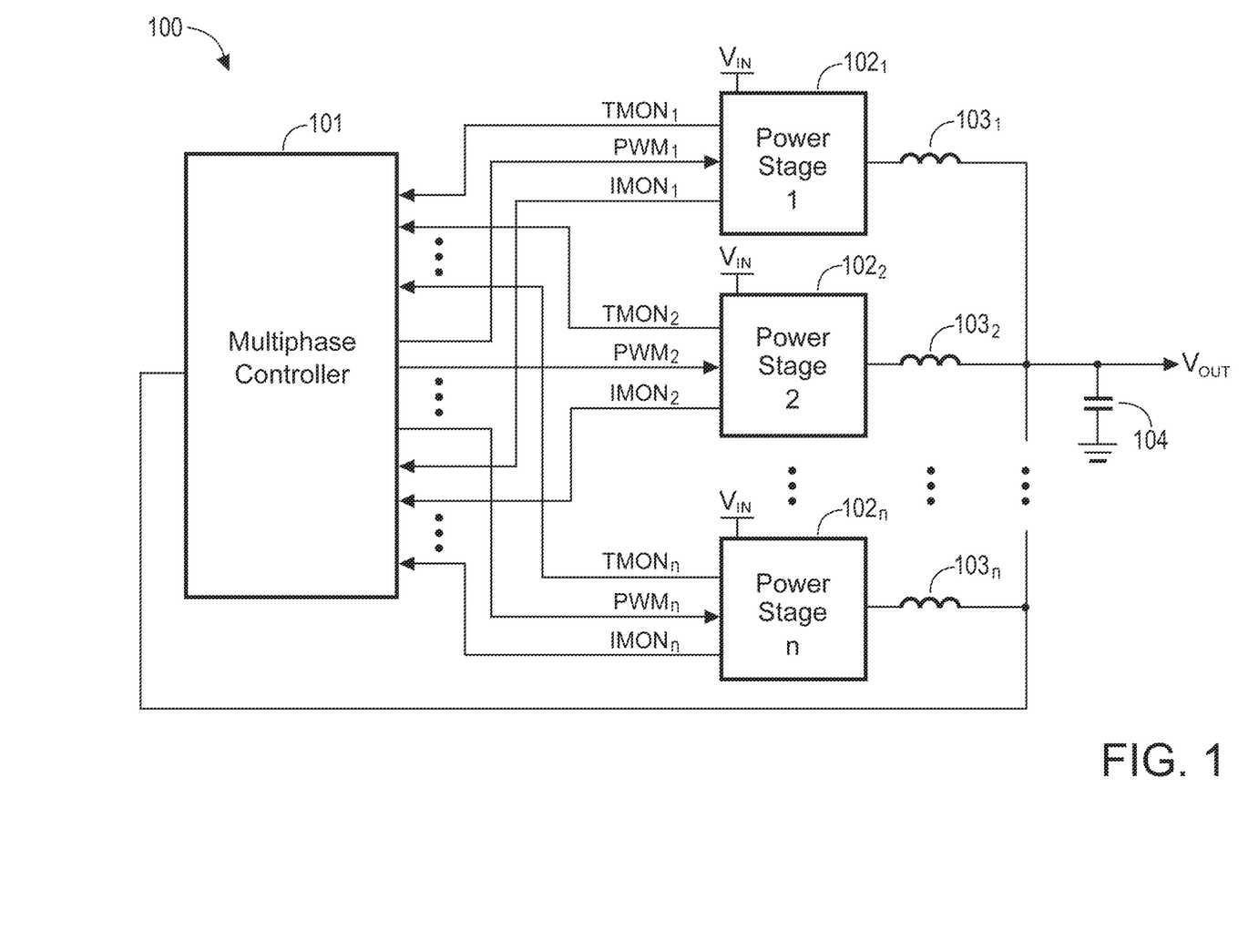
FIG. 1 illustrates in partial block diagram and partial schematic form a multiphase power converter according to an embodiment of the present disclosure.

FIG. 1 illustrates in partial block diagram and partial schematic form a multiphase power converter 100 according to an embodiment of the present disclosure. Multiphase power converter 100 is a multiphase converter that implements a new feature called "predictive failure diagnostic" to improve performance. Multiphase converter 100 includes a multiphase controller 101, a set of power stages 102, a set of inductors 103, and an output capacitor 104. Multiphase controller 101 has an input for receiving a feedback signal, a first set of inputs for receiving temperature monitor signals labeled "$TMON_1$", "$TMON_2$", and "$TMON_n$", a second set of inputs for receiving current monitor signals labeled "$IMON_1$", "$IMON_2$", and "$IMON_n$", and a set of outputs for providing drive signals labeled "$PWM_1$", "$PWM_2$", and "$PWM_n$". Power stages 102 include an arbitrary number n of power stages. FIG. 1 shows exemplary power stages $102_1$, $102_2$, and $102_n$, each having a first input for receiving an input voltage labeled "$V_{IN}$", a second input for receiving a respective drive signal ($PWM_1$, $PWM_2$, or $PWM_n$), a first output, a second output connected to the first set of inputs of multiphase controller 101 for providing a respective temperature monitor signal ($TMON_1$, $TMON_2$, or $TMON_n$), and a third output connected to a respective one of the second set of inputs of multiphase controller 101 for providing a respective current monitor signal ($IMON_1$, $IMON_2$, or $IMON_n$). Inductors 103 include inductors $103_1$, $103_2$, and $103_n$, each having a first terminal connected to the first output of a respective power stage ($102_1$, $102_2$, or $102_n$), and a second terminal connected to the second terminals of other ones of inductors 103 for providing an output voltage labeled "$V_{OUT}$" to a load, not shown in FIG. 1. Output capacitor 104 has a first terminal connected to the second terminals of inductors 103, and a second terminal connected to ground.

In operation, multiphase controller 101 controls power stages 102 to regulate respective phases of $V_{OUT}$. Output capacitor 104 stabilizes $V_{OUT}$ at the output of multiphase converter 100. Multiphase controller 101 controls the switching of power stages 102 in response to the feedback signal, temperature monitor signals, and current monitor signals. Each of power stages 102 has a high-side driver and power transistor, and a low-side driver and power transistor. Control of power stages 102 depends on the feedback signal, but the resistance of the power transistors of power stages 102 and inductors 103 can vary over the lifetime of multiphase power converter 100. This variance in resistance can reduce the efficiency and accuracy of multiphase power converter 100. In normal operation these resistances vary according to healthy aging, which can be predicted and accounted for in the control scheme of multiphase power converter 100; however, abnormal aging can occur due to manufacturing or operation defects. Changes in resistances due to abnormal aging are difficult to predict and adjust for. The changes in resistances may be small fluctuations in resistivity that cannot be measured directly with the required precision, but they can be determined with a high degree of precision according to the techniques disclosed herein. These techniques use the difference between a voltage based on the average of the $IMON_1$, $IMON_2$, and $IMON_n$ signals, and a voltage based on the IMON signal for a particular phase.

Figure 2:
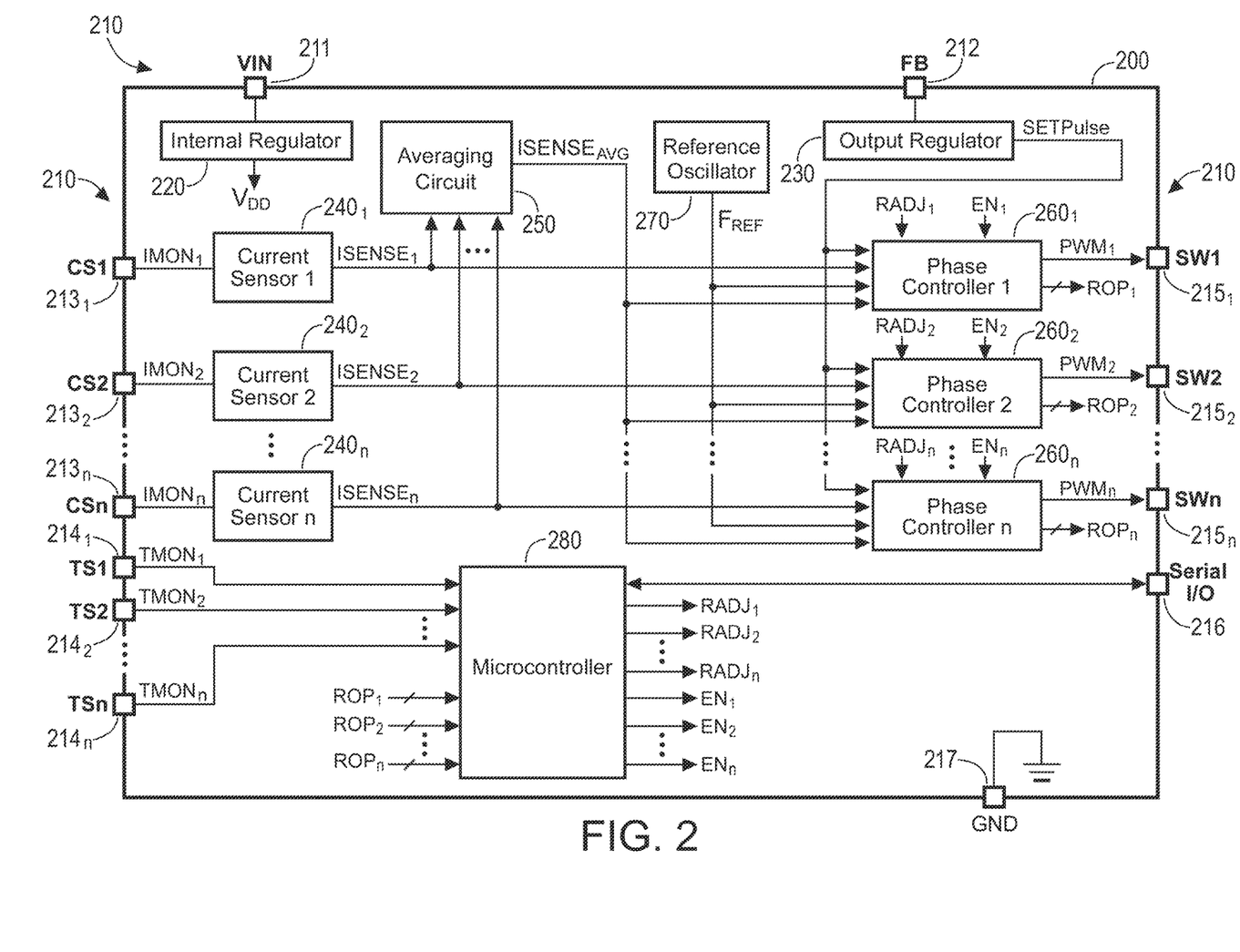
FIG. 2 illustrates in block diagram form a multiphase controller that can be used as the multiphase controller of FIG. 1 according to an embodiment of the present disclosure.

FIG. 2 illustrates in block diagram form a multiphase controller 200 that can be used as the multiphase controller 101 of FIG. 1 according to an embodiment of the present invention. Multiphase controller 200 includes generally a set of external terminals 210, an internal regulator 220, an output regulator 230, a set of current sensors 240, an averaging circuit 250, a set of phase controllers 260, a reference oscillator 270, and a microcontroller 280.

External terminals 210 include a terminal 211 labeled "VIN", a terminal 212 labeled "FB", a set of terminals 213, a set of terminals 214, a set of terminals 215, a terminal 216 labeled "Serial I/O", and a terminal 217 labeled "GND". VIN terminal 211 receives voltage $V_{IN}$. FB terminal 212 receives a feedback voltage representing $V_{OUT}$. Terminals 213 include representative terminals $213_1$ labeled "CS1", $213_2$ labeled "CS2", and $213_n$ labeled "CSn", each for receiving a respective one of $IMON_1$, $IMON_2$, or $IMON_n$ signals. Terminals 214 include representative terminals $214_1$ labeled "TS1", $214_2$ labeled "TS2", and $214_n$ labeled "TSn", each for receiving a respective one of the temperature monitor signals $TMON_1$, $TMON_2$, or $TMON_n$. Terminals 215 include representative terminals $215_1$ labeled "SW1", $215_2$ labeled "SW2", and $215_n$ labeled "SWn", each for providing a respective one of the drive signals $PWM_1$, $PWM_2$, or $PWM_n$. Serial I/O terminal 216 communicates a bidirectional signal to and from multiphase controller 200. GND terminal 217 connects to ground.

Internal regulator 220 has an input connected to VIN terminal 211, and an output for providing an internal power supply voltage labeled "$V_{DD}$" that the circuits internal to multiphase controller 200 use to power their operations.

Output regulator 230 has an input connected to FB terminal 212 and an output for providing a pulse signal labeled "SETPulse".

Current sensors 240 include representative current sensors $240_1$, $240_2$, and $240_n$, each having an input connected to a respective one of terminals 213 and an output for providing a respective one of current sense signals labeled "$ISENSE_1$", "$ISENSE_2$", and "$ISENSE_n$".

Averaging circuit 250 has a set of inputs connected to the outputs of current sensors 240, and an output for providing an averaged signal labeled "$ISENSE_{AVG}$".

Phase controllers 260 include representative phase controllers $260_1$, $260_2$, and $260_n$, each having a first input for receiving a respective one of adjustment signals labeled "$RADJ_1$", "$RADJ_2$", and "$RADJ_n$", a second input for receiving a respective one of enable signals labeled "$EN_1$", "$EN_2$", and "$EN_n$", a third input connected to the output of output regulator 230, a fourth input for connected to the output of a respective one of current sensors 240, a fifth input for receiving a reference frequency signal labeled "$F_{REF}$", a sixth input connected to the output of averaging circuit 250, a first output for providing a respective one of the $PWM_1$, $PWM_2$, and $PWM_n$ signals, and a second output for providing a respective one of digital signals labeled "$ROP_1$", "$ROP_2$", and "$ROP_n$".

Reference oscillator 270 has an output connected to the fifth inputs of phase controllers 260 for providing the $F_{REF}$ signal.

Microcontroller 280 has a first set of inputs connected to terminals 214, a second set of inputs connected to the second outputs of phase controllers 260, a first set of outputs connected to the first inputs of phase controllers 260, a second set of outputs connected to the second inputs of phase controllers 260, and a bidirectional terminal connected to Serial I/O terminal 216 for sending and receiving sequences of input and output signals, respectively.

In operation, multiphase controller 200 is an integrated circuit that operates as a controller that is suitable for use as multiphase controller 101 of FIG. 1, but improves the performance of multiphase converter 100 by implementing a new feature called "failure diagnostics". By using failure diagnostics, multiphase controller 200 adjusts the load on power stages that have experienced aging.

Output regulator 230 receives the feedback signal from FB terminal 212 and supplies the SETPulse. Current sensors 240 receive respective IMON signals and responsively provide the ISENSE signals. Averaging circuit 250 averages the ISENSE signals to form the $ISENSE_{AVG}$ signal. Reference oscillator 270 provides the $F_{REF}$ frequency. Each phase controller 260 generates a respective PWM signal in response to the SETPulse signal, a respective ISENSE signal, the $F_{REF}$ frequency, and the $ISENSE_{AVG}$ signal.

Phase controllers 260 provide respective ROP signals relative to respective ISENSE signals to microcontroller 280. Microcontroller 280 provides a sequence of output signals to Serial I/O terminal 216 representing the information from the ROP signals. An external master controller, not shown in FIG. 2, can be used to divide the values of the ROP signals by respective output currents in order to determine the on resistances ($R_{DSON}$) of respective power stages 102 of FIG. 1. In this example, values of $R_{DSON}$ are stored in the external master controller and reported to a user interface to provide information on manufacturing or operating faults. In these situations users will be able to determine which phase has defects so that the problem can be addressed. The $R_{DSON}$ information is provided to Serial I/O terminal 216 of multiphase controller 200 as a sequence of input signals.

Microcontroller 280 receives the sequence of input signals and provides the RADJ signals to respective phase controllers 260 in order to adjust the PWM signal output by the respective phase controller. In some cases microcontroller 280 disables the respective phase controller 260 by setting a respective EN signal to logic low.

Microcontroller 280 also receives the TMON signals from terminals 214 and provides another sequence of output signals to Serial I/O terminal 216 representing temperature information from the TMON signals. The external master controller receives this other sequence of output signals and calculates temperature drift within the power stages 102 of FIG. 1. The external master controller sends another sequence of input signals to Serial I/O terminal 216 of multiphase controller 200 representing the calculated temperature drift.

Microcontroller 280 receives the other sequence of input signals and provides the RADJ signals to respective phase controllers 260 in order to adjust the PWM signal output by the respective phase controller in response to the calculated temperature drift. In some cases the microcontroller 280 may simply disable the respective phase controller 260 by driving the respective EN signal to logic low.

In the illustrated embodiment, microcontroller 280 provides the values of the ROP signals to an external master controller to perform division operations, but in other embodiments, microcontroller 280 may perform the division operations of the values of the ROP signals by the respective currents. Similarly, while in the illustrated embodiment the external master controller performs temperature drift calculations, in other embodiments, microcontroller 280 may itself perform the temperature drift calculations.

Figure 3:
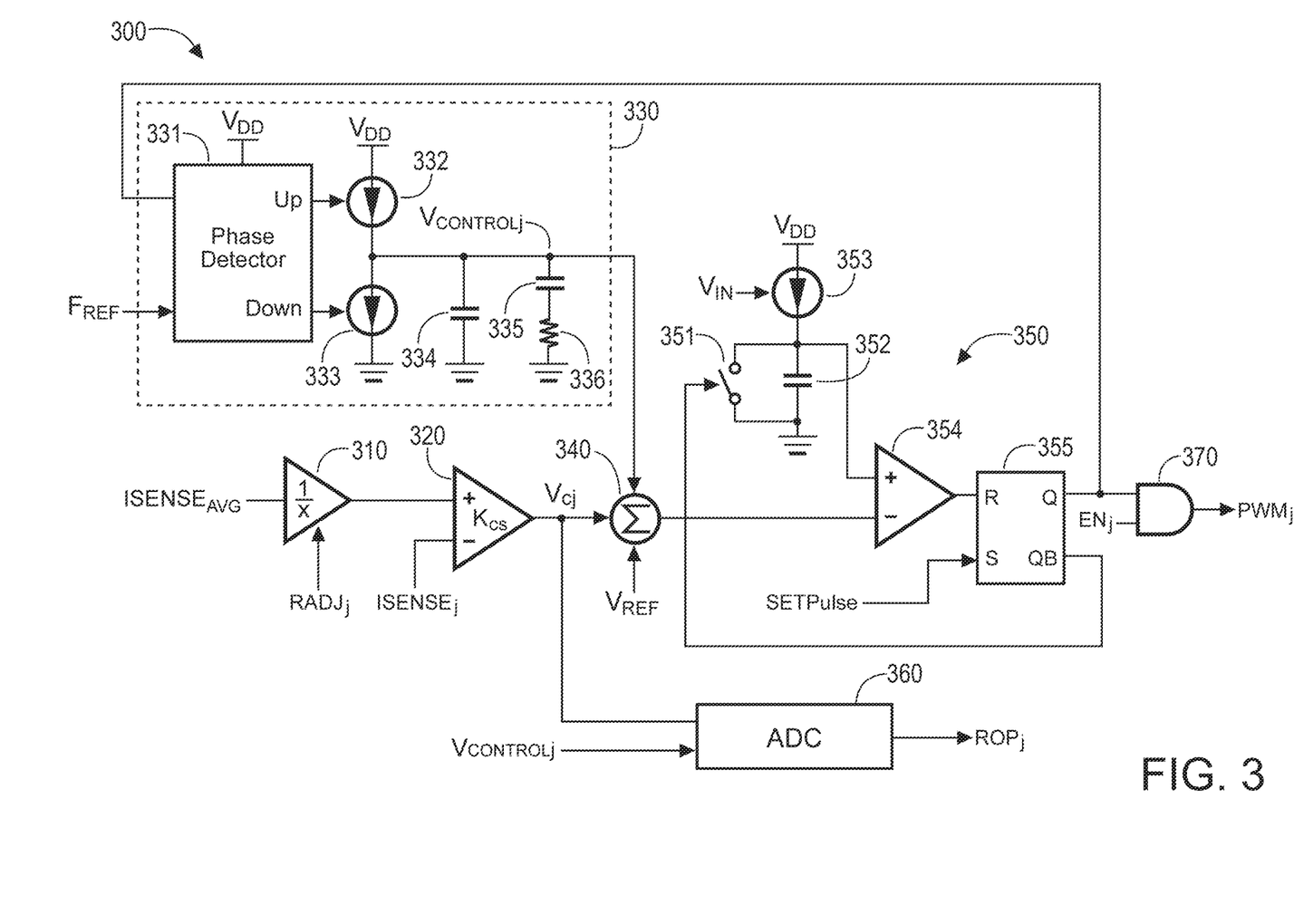
FIG. 3 illustrates in partial block diagram and partial schematic form a phase controller that can be used as any one of the phase controllers of FIG. 2.

FIG. 3 illustrates in partial block diagram and partial schematic form a phase controller 300 that can be used as any one of the phase controllers 260 of FIG. 2. Phase controller 300 generally includes a multiplier 310, an error amplifier 320, a frequency locking loop (FLL) circuit 330, a summing circuit 340, a pulse-width-modulation (PWM) circuit 350, an analog-to-digital converter (ADC) 360, and an output gate 370. Multiplier 310 has a first input for receiving $ISENSE_{AVG}$, a second input for receiving a respective adjustment signal, herein labeled "RADJ$_i$", and an output for providing an adjusted averaged signal. Error amplifier 320 has a non-inverting input connected to the output of multiplier 310, an inverting input for receiving a respective current sense signal, herein labeled "ISENSE$_j$", and an output for providing an error voltage labeled "V$_{Cj}$".

FLL circuit 330 includes a phase detector 331, a first current source 332, a second current source 333, a capacitor 334, a capacitor 335, and a resistor 336. Phase detector 331 has a first input for receiving an internal power supply voltage labeled "V$_{DD}$", a second input for receiving a latch output signal, a third input for receiving the F$_{REF}$ signal, a first output labeled "Up", and a second output labeled "Down". First current source 332 has a first terminal for receiving V$_{DD}$, a second terminal for providing a control voltage labeled "V$_{CONTROLj}$", and a control input connected to the Up output of phase detector 331. Second current source 333 has a first terminal connected to the second terminal of first current source 332, a second terminal connected to ground, and a control input connected to the Down output of phase detector 331. First capacitor 334 has a first terminal connected to the second terminal of first current source 332, and a second terminal connected to ground. Second capacitor 335 has a first terminal connected to the second terminal of first current source 332, and a second terminal. Resistor 336 has a first terminal connected to the second terminal of second capacitor 335, and a second terminal connected to ground.

Summing circuit 340 has a first input connected to the second terminal of first current source 332 for receiving V$_{CONTROLj}$, a second input connected to the output of error amplifier 320 for receiving V$_{Cj}$, a third input for receiving a reference voltage labeled "V$_{REF}$", and an output for providing a sum of V$_{CONTROLj}$, V$_{Cj}$, and V$_{REF}$.

PWM circuit 350 includes a switch 351, a capacitor 352, a current source 353, a PWM comparator 354, and a PWM latch 355. Switch 351 has a first terminal, a second terminal connected to ground, and a control input for receiving an inverted latch output signal. Capacitor 352 has a first terminal connected to the first terminal of switch 351, and a second terminal connected to ground. Current source 353 has a first terminal for receiving V$_{DD}$, a second terminal connected to the first terminal of capacitor 352, and a control input for receiving a voltage representative of V$_{BUS}$ of FIG. 1 labeled "V$_{IN}$". PWM comparator 354 has a non-inverting input connected to the first terminal of capacitor 352, an inverting input connected to the output of summing circuit 340, and an output. PWM latch 355 has a reset input labeled "R" connected to the output of PWM comparator 354, a set input labeled "S" for receiving the SETPulse signal, a first output labeled "Q" for providing the latch output signal, and a second output labeled "QB" for providing the inverted latch output signal.

ADC 360 has a first input for receiving V$_{CONTROLj}$, a second input connected to the output of error amplifier 320 for receiving V$_{Cj}$, and an output for providing a respective digital signal, herein labeled "ROP$_j$".

Output gate 370 is an AND logic gate with a first input connected to the Q output of PWM latch 355, a second output for receiving a respective enable signal labeled "EN$_j$", and an output for providing a respective drive signal, herein labeled "PWM$_j$".

In operation, phase controller 300 operates as a controller that is suitable for use as any of the phase controllers 260 in FIG. 2. Phase controller 300 uses PWM$_j$ to control a duty cycle "Duty" of a respective power stage (such as one of the power stages 102 of FIG. 1) and alternately control a high-side transistor and a low-side transistor of the respective power stage in order to regulate V$_{OUT}$ to a desired level. When PWM$_j$ is high, the respective power stage drives an output current "I$_{OUT}$" through the corresponding inductor which causes a voltage drop V$_L$, wherein V$_L$ can be calculated using the following equation:

$$V_L = (V_{IN} - R_{HS} \cdot I_{OUT} - V_{OUT} - R_L \cdot I_{OUT}) \cdot \text{Duty} \quad (1)$$

where "R$_{HS}$" is the R$_{DSON}$ of the high-side transistor, "R$_L$" is the parasitic resistance of the related inductor. When PWM$_j$ is low, V$_L$ can be calculated using the following equation:

$$V_L = (-R_{LS} \cdot I_{OUT} - V_{OUT} - R_L \cdot I_{OUT}) \cdot (1-\text{Duty}) \quad (2)$$

where "R$_{LS}$" is the R$_{DSON}$ of the low-side transistor. According to the inductor balance rule for a buck converter, when the power stage reaches steady state, the sum of V$_L$ when PWM$_j$ is high and V$_L$ when PWM$_j$ is low equals zero. Using this rule, the relationship between equations 1 and 2 in steady state can be simplified as follows:

$$\begin{aligned} V_{L(PWMj\ High)} + V_{L(PWMj\ Low)} = 0 &\rightarrow (V_{IN} - R_{HS} \cdot I_{OUT} - \\ V_{OUT} - R_L \cdot I_{OUT}) \cdot \text{Duty} &= (R_{LS} \cdot I_{OUT} + V_{OUT} R_L \cdot I_{OUT}) \cdot \\ (1-\text{Duty}) &\rightarrow (V_{IN} - R_{HS} \cdot I_{OUT} + R_{LS} \cdot \\ I_{OUT}) \cdot \text{Duty} &= V_{OUT} + R_{LS} \cdot I_{OUT} + R_L \cdot I_{OUT} \end{aligned} \quad (3)$$

From equation 3, the steady state value for Duty can be calculated as:

$$\text{Duty} = \frac{(V_{OUT} + R_{LS} \cdot I_{OUT} + R_L \cdot I_{OUT})}{(V_{IN} - R_{HS} \cdot I_{OUT} + R_{LS} \cdot I_{OUT})} \quad (4)$$

In many applications, R$_L$ is expected to be significantly smaller than R$_{LS}$, and for this reason R$_L$ can be omitted from further calculations. Also, in many applications, R$_{LS}$ is expected to be significantly smaller than R$_{HS}$, and for this reason the R$_{LS} \cdot I_{OUT}$ term in the denominator of equation 4 can be omitted from further calculations. The following is a simplified equation for Duty used for the proceeding calculations:

$$\text{Duty} = \frac{(V_{OUT} + R_{LS} \cdot I_{OUT})}{(V_{IN} - R_{HS} \cdot I_{OUT})} \quad (5)$$

In closed loop operation, phase controller 300 regulates the respective power stage using V$_{CONTROLj}$ as a control reference voltage.

Phase controller 300 uses constant on-time control to control PWMj. PWMj sets the on-time of the respective power stage, "TON", which is determined by the following equation:

$$T_{ON} = \frac{V_{CONTROLj}}{V_{IN}} \cdot T_{SW} \quad (6)$$

wherein "T$_{SW}$" is the switching time of the respective power stage. The duty ratio of phase controller 300 is equal to T$_{ON}$/T$_{SWi}$, where T$_{SWi}$ is the instantaneous switching period. In constant on-time control T$_{ON}$ is set by phase controller 300 and T$_{OFF}$ is regulated by output regulator 230 of FIG. 2. As T$_{SWi}$ varies, the nominal switching frequency, "F$_{SWi}$", is determined by the following equation:

$$F_{SWi} = \frac{V_{IN} \cdot (V_{OUT} + R_{LS} \cdot I_{OUT})}{V_{CONTROLj} \cdot T_{SW} \cdot (V_{IN} - R_{HS} \cdot I_{OUT})} \quad (7)$$

Over time and use the value of $R_{HS}$ and/or $R_{LS}$ can vary, which can affect $F_{SWi}$. As $R_{LS}$ changes, $F_{SWi}$ varies according to the following equation:

$$d\left(\frac{F_{SWi}}{F_{SW}}\right) = \frac{d(R_{LS})}{R_{LS}} \cdot \frac{R_{LS} \cdot I_{OUT}}{V_{CONTROLj}} = \frac{d(R_{LS})}{R_{LS}} \cdot \frac{R_{LS}}{R_{OUT}} \quad (8)$$

wherein $R_{OUT}$ is equal to $V_{OUT}/I_{OUT}$. According to equation 8, changes in resistance have a small effect on $F_{SWi}$. In one illustrative example, if $R_{LS}$ equals 1 mΩ and $R_{OUT}$ equals 25 mΩ (1V/40 A) and the variation is 20%, the frequency variation is 0.8%. In this example, if $F_{SW}$ is 500 KHz, the variation causes the phase controller to output $PWM_j$ at a frequency of 504 KHz, meaning the sensor must measure a variation of only 20 ns, which can be difficult. In order to get $F_{SWi}$ to equal $F_{REF}$, FLL circuit 330 adjusts the value of $V_{CONTROLj}$.

FLL circuit 330 adjusts the value of $V_{CONTROLj}$ as $F_{SWi}$ varies by adjusting $V_{CONTROLj}$ in a positive direction as $R_{LS}$ increases and adjusting $V_{CONTROLj}$ in a negative direction as $R_{LS}$ decreases. When $F_{SWi}$ is equal to $F_{SWi}$ $V_{CONTROLj}$ is calculated by the following equation:

$$V_{CONTROLj} = V_{IN} \cdot \frac{V_{OUT} + R_{LS} \cdot I_{OUT}}{V_{IN} - R_{HS} \cdot I_{OUT}} \quad (9)$$

Sensitivity of FLL circuit 330 to change in $R_{LS}$ can be calculated as:

$$\frac{d}{dR_{LS}}(V_{CONTROLj}) = \frac{V_{IN} \cdot I_{OUT}}{V_{IN} - R_{HS} \cdot I_{OUT}} \quad (10)$$

From equation 10, it can be determined that the sensitivity of FLL circuit 330 is related directly to $I_{OUT}$ when $V_{IN}$ is much larger than $R_{HS} \cdot I_{OUT}$. Sensitivity of FLL circuit 330 to change in $R_{HS}$ can be calculated as:

$$\frac{d}{dR_{HS}}(V_{CONTROLj}) = \frac{V_{IN} \cdot I_{OUT} \cdot (V_{OUT} + R_{LS} \cdot I_{OUT})}{(V_{IN} - R_{HS} \cdot I_{OUT})^2} \quad (11)$$

When $V_{IN}$ is much larger than $R_{HS} \cdot I_{OUT}$, the sensitivity to $R_{HS}$ is related directly to $I_{OUT} \cdot$Duty. Since sensitivity is high, stress on the system is low as long as $I_{OUT}$ is low.

Phase controller 300 controls one power stage within a multiphase power converter, such as one of power stages 102 in multiphase power converter 100 of FIG. 1. Phase controller 300 uses the $ISENSE_{AVG}$ signal and the $ISENSE_j$ signal to improve performance of phase controller 300. Error amplifier 320 introduces a current sharing function to form $V_{Cj}$ in response to an error between the $ISENSE_{AVG}$ and $ISENSE_j$ signals. If error amplifier 320 has a large gain then $I_{OUT}$ will equal the total output current of multiphase controller 100 of FIG. 1 divided by the number of phases. Since FLL circuit 330 regulates $T_{SW}$ to equal $T_{SWi}$, variations in $R_{LS}$ produce variations in $V_{CONTROLj}$. Since the average $R_{LS}$ among phases has changed, there is also a variation of the average of $V_{CONTROLj}$ because of the action of FLL circuit 330. By measuring $V_{CONTROLj}-V_{OUT}$, the average value of resistivity between $R_{LS}$ and $R_{HS}$ can be calculated using the following equation:

$$V_{CONTROLj} - V_{OUT} = \quad (12)$$

$$\frac{V_{IN}}{V_{IN} - R_{HS} \cdot I_{OUT}} \cdot \left(R_{LS} \cdot I_{OUT} + R_{HS} \cdot I_{out} \cdot \frac{V_{OUT}}{V_{IN}}\right)$$

If $V_{IN}$ is much larger than $R_{HS} \cdot I_{OUT}$, then the average value of resistivity between $R_{LS}$ and $R_{HS}$ can be simplified to:

$$V_{CONTROLj} - V_{OUT} = R_{LS} \cdot I_{OUT} + R_{HS} \cdot I_{OUT} \cdot \text{Duty} \quad (13)$$

Based off equation 11, the following relationship is used to determine $V_{CONTROLj}$ for the respective power stage:

$$V_{CONTROLj} - V_{OUT} = R_{LS} \cdot I_{OUT} + R_{HS} \cdot I_{out} \cdot \text{Duty} + \frac{\Delta R_{LS}}{n} \cdot I_{OUT} \quad (14)$$

The current sharing function reflects changes in resistivity for all components of the respective power stage. By measuring $V_{Cj}-V_{OUT}$, the average value of resistivity between $R_{LS}$ and $R_{HS}$ can be calculated using the following equation:

$$V_{Cj} - V_{OUT} = R_{LS} \cdot I_{OUT} + R_{HS} \cdot I_{OUT} \cdot \text{Duty} \quad (15)$$

Phase current of the respective power stage is sensed as a voltage across the respective low-side transistor, for example by implementing a current sense amplifier. This voltage is provided to phase controller 300 as the $ISENSE_j$ signal and is equal to $R_{LS} \cdot I_{OUT}$. $V_{Cj}$ is formed by measuring the error between the $ISENSE_j$ and $ISENSE_{AvG}$ signals. Using the relationship of $ISENSE_j$ and $I_{OUT}$, equation 15 can be simplified to:

$$V_{Cj} - V_{OUT} = ISENSE_j + R_{HS} \cdot \frac{ISENSE_j}{R_{LS}} \cdot \text{Duty} \quad (16)$$

From equation 16, the change in $V_{Cj}$ can be determined with respect to changes in $R_{LS}$ and $R_{HS}$ as follows:

$$\frac{d}{dR_{LS}}(V_{Cj}) = -\frac{\text{Duty} \cdot ISENSE_j \cdot R_{HS}}{R_{LS}^2} \quad (17)$$

$$\frac{d}{dR_{HS}}(V_C) = \frac{\text{Duty} \cdot ISENSE_j}{R_{LS}} \quad (18)$$

From equations 13 and 15, the total changes in resistivity of the respective power stage can be calculated by measuring $V_{Cj}-V_{CONTROLj}$:

$$V_{Cj}-V_{CONTROLj}=\Delta R_{LS} \cdot I_{OUT}+\Delta R_{HS} \cdot I_{OUT} \cdot \text{Duty} \quad (19)$$

Phase resistance of the respective power stage can be calculated outside of phase controller 300 by dividing $V_{Cj}-V_{CONTROLj}$ by $I_{OUT}$:

$$R_{Pj} = \frac{V_{Cj} - V_{CONTROLj}}{I_{OUT}} = \Delta R_{LS} + \Delta R_{HS} \cdot \text{Duty} \quad (20)$$

By calculating $R_{Pj}$, small resistances and small changes in resistance can be detected. This technique allows systems to detect relatively small changes in resistance that reflect abnormal aging and take appropriate corrective action. The example described above uses equation 5 for calculating Duty and is suitable for many applications in which $R_L$ is much smaller than $R_{LS}$ and $R_{LS}$ is much smaller than $R_{HS}$.

For applications in which including $R_L$ and/or further defining $R_{LS}$ are preferred, one skilled in the art can alter equation 20 to include terms for $R_L$ and/or additional terms for $R_{LS}$ based on using equation 4 for Duty in combination with the calculations described in equations 6 through 20.

Phase controller 300 implements the described calculation of $R_{Pj}$ through the use of ADC 360, communication to microcontroller 280 of FIG. 2, and the external master controller. ADC 360 receives $V_{Cj}$ and $V_{CONTROLj}$ and develops $ROP_j$ representing equation 17. $ROP_j$ is sent to microcontroller 280, which exports a digital sequence representing $ROP_j$ to the external master controller. The external master controller receives the digital sequence and divides it by $I_{OUT}$ for the respective phase to calculate $R_{Pj}$. The external master controller provides another digital sequence to microcontroller 280 representing the calculated value of $R_{Pj}$. Microcontroller 280 provides a digital value representing $R_{Pj}$ to phase controller 300 as the $RADJ_j$ signal. Multiplier 310 adjusts $ISENSE_{AvG}$ in response to $RADJ_j$ to account for changes in resistivity. In some cases, microcontroller 280 may disable phase controller 300 by setting the $EN_j$ signal to a logic low.

Figure 4:
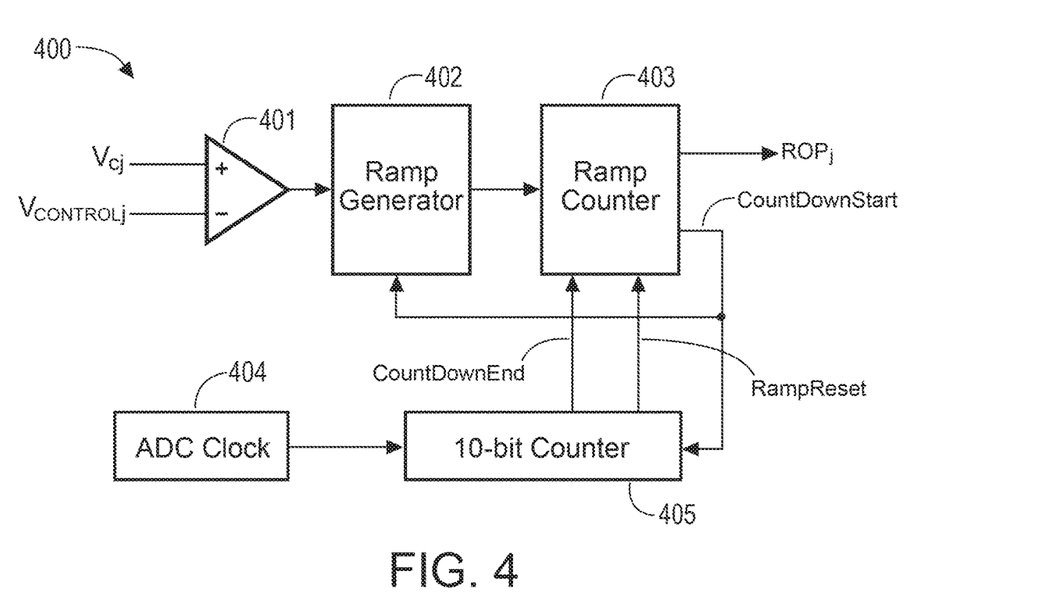
FIG. 4 illustrates in block diagram form an analog-to-digital converter that can be used as the analog-to-digital converter of FIG. 3.

FIG. 4 illustrates in block diagram form an ADC 400 that can be used as ADC 360 of FIG. 3. ADC 400 is a multi-ramp ADC that generally includes an amplifier 401, a ramp generator 402, a ramp counter 403, an ADC clock circuit 404, and a clock counter 405. Amplifier 401 has a non-inverting input for receiving $V_{Cj}$, an inverting input for receiving $V_{CONTROLj}$, and an output for providing a voltage proportional to an instantaneous difference between $V_{Cj}$ and $V_{CONTROLj}$. Ramp generator 402 has a first input connected to the output of amplifier 401, a second input for receiving a countdown starting signal labeled "CountDownStart", and an output for providing a ramp signal. Ramp counter 403 has a first input connected to the output of ramp generator 402, a second input for receiving a reset signal labeled "CountDownEnd", a third input for receiving a countdown ending signal labeled "RampReset", a first output for providing the $ROP_j$ signal, and a second output for providing the CountDownStart signal. ADC clock circuit 404 has an output for providing an ADC clock signal. Clock counter 405 is a 10-bit counter with a first input for receiving the CountDownStart signal, a second input for receiving the ADC clock signal, a first output for providing the CountDownEnd, and a second output for providing the RampReset signal.

In operation, ADC 400 is a multi-ramp ADC suitable for use as ADC 360 of FIG. 3. Amplifier 401 receives $V_{Cj}$ and $V_{CONTROLj}$ and provides the voltage equal to the instantaneous difference between the two voltages. Ramp generator 402 receives the voltage difference and generates the ramp signal whose slope is proportional to $V_{Cj}-V_{CONTROLj}$. Ramp counter 403 receives the ramp signal and counts a number of ramps generated across periods.

The operation of ADC 400 begins in a "counting period". During the counting period ramp counter 403 counts the number of ramps of the ramp signal. At the start of the counting period ramp counter 403 provides the CountDownStart signal at a logic low value. Clock counter 405 receives the logic low CountDownStart signal and begins counting the times the ADC clock signal goes to a logic high state during the counting period. The counting period ends when the count of ramp counter 403 reaches a predetermined threshold, e.g. 255 ramps, at which point the CountDownStart signal switches to a logic high.

Once the counting period ends, a measuring period begins. When the measuring period starts, clock counter 405 resets the count of ramp counter 403 with the RampReset signal. During the measuring period ramp counter 403 counts how many ramps are generated. Clock counter 405 counts down from the number of clock signals counted during the counting period. When clock counter 405 reaches zero the measuring period ends and the CountDownEnd signal switches to a logic high value. Ramp counter 403 stops counting ramps and outputs its current count value as multi-bit digital signal $ROP_j$ in response to the CountDownEnd signal. After the measuring period ends, ramp counter 403 and clock counter 405 are both reset and the operation repeats. In this manner, ADC 400 provides a high resolution value of $(V_{Cj}-V_{CONTROLj})$ that is representative of the phase resistance.

Figure 5:
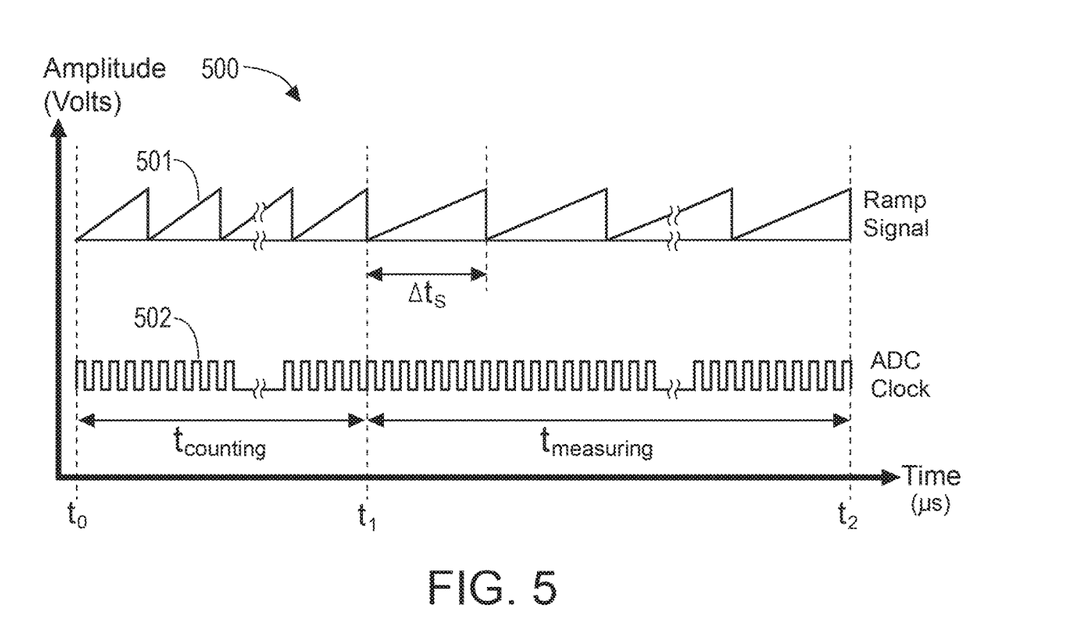
FIG. 5 illustrates a timing diagram useful in understanding the operation of the analog-to-digital converter of FIG. 4.

FIG. 5 illustrates a timing diagram 500 useful in understanding the operation of analog-to-digital converter 400 of FIG. 4. In timing diagram 500, the horizontal axis represents time in and the vertical axis represents the amplitude of signals in volts. Timing diagram 500 includes a waveform 501 depicting the ramp signal, and a waveform 502 depicting the ADC clock signal. Waveform 501 has a predetermined peak set by ramp generator 402 of FIG. 4. The horizontal axis includes three time markers labeled "$t_0$", "$t_1$", and "$t_2$".

The operation shown in FIG. 5 begins at the start of the counting period, labeled "$t_{counting}$", at time $t_0$. During $t_{counting}$, waveform 501 rises to its peak, resets at zero, and rises again. Each peak of waveform 501 is counted by ramp counter 403 of FIG. 4. Waveform 502 illustrates the clock signal during $t_{counting}$. At this time, the number of times waveform 502 goes to a logic high state is counted by clock counter 405 of FIG. 4. Once ramp counter 403 counts the predetermined number of peaks of the ramp signal, $t_{counting}$ ends at time $t_1$ and the ramp count is reset to zero. After $t_{counting}$ ends, the measuring period, labeled "$t_{measuring}$", begins at time $t_1$. When $t_{measuring}$ begins, the clock counter starts counting down when waveform 502 goes to a logic high state from the number of ADC clock signals counted during $t_{counting}$. At the same time, waveform 501 continues ramping to its peak throughout $t_{measuring}$. Once clock counter 405 reaches zero, $t_{measuring}$ ends at time $t_2$ and the ramp count is output as multi-bit digital signal $ROP_j$.

Thus various embodiments of a multiphase controller, a multiphase converter, and a corresponding method have been described. The various embodiments provide failure diagnostics in multiphase applications. Embodiments of the present disclosure determine small changes in phase resistance in each power stage using voltages already present within the control loop. Known techniques of measuring resistance can be inaccurate, cost prohibitive, or increase power dissipation of the multiphase converter. Embodiments of the present disclosure adjust operation of individual power stages in order to account for the changes in phase resistance. For example, a multi-phase controller using failure diagnostics reduces the current sharing reference to slow down phase aging. In another example, a multiphase controller using failure diagnostics may disable a single phase. In yet another example, a multiphase controller using failure diagnostics reports information to an external controller so that variations in phase resistance can be stored and interpreted by either a user or software algorithm. In yet another example, a multiphase controller using failure diagnostics reports stress events to the external controller, such as output current for a phase exceeding a threshold.

The above-disclosed subject matter is to be considered illustrative, and not restrictive, and the appended claims are intended to cover all such modifications, enhancements, and other embodiments that fall within the true scope of the claims. For example, while multi-ramp ADCs are one useful architecture for performing the analog-to-digital conversion described herein, other ADCs can be used to. Moreover, the failure diagnostic methods described above can be used in multiphase converter architectures using more or fewer power stages than depicted in the enclosed figures.

Thus, to the maximum extent allowed by law, the scope of the present invention is to be determined by the broadest permissible interpretation of the following claims and their equivalents, and shall not be restricted by the forgoing detailed description.

What is claimed is:

1. A multiphase controller for controlling a plurality of phases using a corresponding plurality of phase controllers, comprising:
   a plurality of inputs, each for receiving a respective current monitor signal;
   an averaging circuit for generating an averaged signal representative of an average of the current monitor signals received from said plurality of inputs;
   wherein each phase controller generates an error voltage in response to said averaged signal and said respective current monitor signal, controls a drive signal in response to said error voltage and a control voltage, and provides a digital signal representative of a difference between said error voltage and said control voltage; and
   wherein the multiphase controller provides an adjustment signal representative of said digital signal divided by a corresponding output current for each phase controller, wherein said adjustment signal adjusts a corresponding error voltage.

2. The multiphase controller of claim 1, wherein each phase controller comprises:
   a phase detector for providing said control voltage in response to a difference between said drive signal and a reference frequency signal.

3. The multiphase controller of claim 1, wherein each phase controller comprises:
   a multiplier circuit for providing an adjusted averaged signal representative of a product of said averaged signal and a percentage value, wherein said percentage value is determined by said adjustment signal; and
   an error amplifier for providing said error voltage in response to a difference between said adjusted averaged signal and said respective current monitor signal.

4. The multiphase controller of claim 1, wherein each phase controller further comprises an analog to digital converter responsive to said error voltage and said control voltage for providing said digital signal.

5. The multiphase controller of claim 4, wherein said analog to digital converter is a multi-ramp converter.

6. The multiphase controller of claim 5, wherein said analog to digital converter comprises:
   a clock counter for generating a clock count signal representative of a count of clock cycles over a counting period;
   a ramp generator for generating a ramp signal in response to said difference between said error voltage and said control voltage; and
   a ramp counter for providing an end counting period signal in response to a first count of said ramp signal reaching a predetermined count over said counting period, wherein said end counting period signal starts a measuring period,
   wherein said clock counter counts down a number of clock cycles equal to said count of clock cycles over said counting period and responsively generates an end measuring period signal when said number of clock cycles reaches a predetermined value, and
   wherein said ramp counter provides said digital signal in response to a second count of said ramp signal at an activation of said end measuring period signal, wherein said digital signal is a multi-bit signal representative of said second count of said ramp signal over said measuring period.

7. The multiphase controller of claim 1, wherein the multiphase controller provides a first sequence of input/output signals representative of said digital signal, and provides each of said adjustment signals in response to a second sequence of input/output signals.

8. The multiphase controller of claim 1, wherein the multiphase controller provides, for each phase controller, a disable signal in response to said adjustment signal passing a predetermined threshold, wherein said disable signal disables said phase controller.

9. A multiphase DC-DC converter, comprising:
   a plurality of power stages each having a first input for receiving an operating voltage, a second input for receiving a drive signal, a first output for providing an inductor drive signal, and a second output for providing a respective current monitor signal representative of a current flowing through said power stage;
   a plurality of inductors, each inductor having a first terminal coupled to said first output of a respective one of said plurality of power stages and a second terminal;
   an output capacitor having a first terminal coupled to each of said second terminals of said plurality of inductors, and a second terminal coupled to a power supply terminal; and
   a multiphase controller for controlling said plurality of power stages using a corresponding plurality of phase controllers, said multiphase controller comprising:
      a plurality of inputs, each for receiving said current monitor signal of a respective power stage;
      an averaging circuit for generating an averaged signal representative of an average of the current monitor signals received from said plurality of inputs;
      wherein each phase controller generates an error voltage in response to said averaged signal and a respective current monitor signal, controls said drive signal of said respective power stage in response to said error voltage and a control voltage, and provides a digital signal representative of a difference between said error voltage and said control voltage; and
      wherein said multiphase controller provides an adjustment signal in response to said digital signal divided by a corresponding output current for each phase controller, wherein said adjustment signal adjusts said error voltage.

10. The multiphase DC-DC converter of claim 9, wherein each phase controller further comprises:
    a phase detector for providing said control voltage in response to a difference between said drive signal and a reference frequency signal.

11. The multiphase DC-DC converter of claim 9, wherein each phase controller further comprises:
    a multiplier circuit for providing an adjusted averaged signal representative of a product of said averaged signal and a percentage value, wherein said percentage value is determined by said adjustment signal; and
    an error amplifier for providing said error voltage in response to a difference between said adjusted averaged signal and said respective current monitor signal.

12. The multiphase DC-DC converter of claim 9, wherein each phase controller further comprises an analog to digital converter responsive to said error voltage and said control voltage for providing said digital signal.

13. The multiphase DC-DC converter of claim 12, wherein said analog to digital converter is a multi-ramp converter.

14. The multiphase DC-DC converter of claim 13, wherein said analog to digital converter comprises:
- a clock counter for generating a clock count signal representative of a count of clock cycles over a counting period;
- a ramp generator for generating a ramp signal in response to said difference between said error voltage and said control voltage;
- a ramp counter for providing an end counting period signal in response to a first count of said ramp signal reaching a predetermined count over said counting period, wherein said end counting period signal starts a measuring period; and
- wherein said clock counter counts down a number of clock cycles equal to said count of clock cycles over said counting period and responsively generates an end measuring period signal when said number of clock cycles reaches a predetermined value,
- wherein said ramp counter provides said digital signal in response to a second count of said ramp signal at an activation of said end measuring period signal, wherein said digital signal is a multi-bit signal representative of said second count of said ramp signal over said measuring period.

15. The multiphase DC-DC converter of claim 9, wherein said multiphase controller further comprises a bidirectional communication terminal for outputting a first sequence of input/output signals representative of said digital signal and receiving a second sequence of input/output signals, wherein said multiphase controller provides said adjustment signals in response to said second sequence of input/output signals.

16. A method for controlling a multiphase DC-DC converter, comprising:
- measuring a plurality of currents, wherein each of said plurality of currents represents a current flowing through a respective power stage;
- averaging said plurality of currents to generate an average of said plurality of currents;
- determining, for each of a plurality of phases, a respective error voltage as a difference between said average of said plurality of currents and a respective one of said plurality of currents to generate a plurality of error voltages;
- controlling, for each of said plurality of phases, an on-time of said respective power stage in response to said respective error voltage and a respective control voltage;
- generating, for each of said plurality of phases, a digital signal in response to a difference between said respective control voltage and said respective error voltage; and
- adjusting, for each of said plurality of phases, said respective error voltage in response to said digital signal divided by a respective output current.

17. The method of claim 16 further comprising determining, for each of said plurality of phases, said respective control voltage in response to a difference between said on-time of said respective power stage and a reference frequency signal.

18. The method of claim 16, wherein said generating said digital signal comprises:
- generating a ramp signal in response to said difference between said respective control voltage and said respective error voltage; and
- counting a first number of peaks of said ramp signal during a measuring period and responsively generating said digital signal.

19. The method of claim 18, wherein said generating said digital signal further comprises:
- counting a second number of peaks of said ramp signal during a count-up period;
- counting a number of clock cycles during said count-up period;
- stopping said count-up period when said second number of peaks of said ramp signal reaches a threshold, wherein said stopping starts said measuring period;
- counting down said number of clock cycles during said measuring period; and
- stopping said measuring period when said number of clock cycles equals zero.

20. The method of claim 16, wherein said adjusting said respective error voltage comprises multiplying said average of said plurality of currents by a percentage value determined by a respective adjustment signal.

* * * * *